United States Patent

Nam et al.

[11] Patent Number: 5,859,439
[45] Date of Patent: Jan. 12, 1999

[54] APPARATUS FOR ALIGNING SEMICONDUCTOR WAFER USING MIXED LIGHT WITH DIFFERENT WAVELENGTHS

[75] Inventors: Byung-Ho Nam, Kyungsangbook-Do; Jae-Keun Jeong, Choongcheongbuk-Do, both of Rep. of Korea

[73] Assignee: LG Semicon Co., Ltd., Choongcheongbuk-Do, Rep. of Korea

[21] Appl. No.: 774,680

[22] Filed: Dec. 26, 1996

[30] Foreign Application Priority Data

Dec. 27, 1995 [KR] Rep. of Korea .................. 58731/1995

[51] Int. Cl.[6] ............................ G01N 21/86; G01B 11/00
[52] U.S. Cl. ................ 250/548; 250/559.3; 250/559.44; 250/237 G; 356/363; 356/400
[58] Field of Search .............................. 250/548, 237 G, 250/559.29, 559.3, 559.44; 356/375, 373, 372, 399, 400, 401, 363, 358, 357, 356, 355, 354, 351, 349, 364, 369

[56] References Cited

U.S. PATENT DOCUMENTS

| 4,669,883 | 6/1987 | Ina et al. | 250/548 |
|---|---|---|---|
| 5,191,465 | 3/1993 | Yamashita et al. | 356/363 |
| 5,194,744 | 3/1993 | Aoki et al. | 250/548 |
| 5,461,237 | 10/1995 | Wakamoto et al. | 250/548 |
| 5,602,644 | 2/1997 | Ota | 250/548 |
| 5,610,718 | 3/1997 | Sentoku et al. | 356/351 |

Primary Examiner—Edward P. Westin
Assistant Examiner—John R. Lee

[57] ABSTRACT

An alignment system of a lithography apparatus which is capable of obtaining an alignment mark without being influenced the height of the alignment mark and the thickness of the photoresist, includes a plurality of light sources emitting a light having each different wavelength, a plurality of beam splitters which reflects some portion of light emitted from the light source and transmits other portion of light and combines the reflected light to emit, a spacial filter for transmitting a light incident through the beam splitter, a first lens for condensing the light transmitted through the spacial filter, a wafer stage on an upper surface of which the wafer having a plurality of alignment marks to diffract a beam incident from the first lens is mounted, a second lens for condensing the light diffracted from the alignment mark on the wafer, a diffraction grating for diffracting the direction of the beam condensed in the second lens, a light collecting device for collecting the light reflected in the diffraction grating and converting the light into an electrical signal, and a control unit from controlling the wafer stage in accordance with the signal applied from the light collecting device.

20 Claims, 4 Drawing Sheets

ALIGNMENT MARK

APPARATUS FOR ALIGNING SEMICONDUCTOR WAFER USING MIXED LIGHT WITH DIFFERENT WAVELENGTHS

BACKGROUND OF THE INVENTION

1. Field of the Invention

The present invention relates to an alignment system of a lithography apparatus, and more particularly, to an improved alignment system of a lithography apparatus in which an alignment position corresponds to a light exposing position.

2. Description of the Background Art

Generally, a wafer aligning method includes two methods. One is a method where an alignment light is incident from an alignment system of a lithography apparatus, the incident is light is diffracted, and the diffracted light is collected from an alignment mark on a wafer. The other is an image processing method where the light diffracted from the alignment mark is formed as an image on a charge coupled device (CCD) and the converted electrical signal is processed.

FIG. 1 is a view showing a construction of an alignment system of a lithography apparatus with the method using a diffraction light and the image processing method according to the conventional art. An alignment system for adopting the method using a diffraction light includes a wafer stage (not illustrated) having a wafer 3 mounted thereon, a helium-neon laser 7 for emitting a laser beam which is a coherent beam serving as a light source, a plurality of beam splitters 4 for reflecting a portion of the laser beam and transmitting another portion thereof, an alignment mark 10 mounted on the wafer 3 for reflecting the beam incident on the wafer 3 from the beam splitter 4 and an objective lens, a light collecting device 9 for collecting the beam when the reflected beam is splitted in the beam splitter 4 and passes through a spacial filter 11, and a signal processor (not illustrated) electrically connected to the light collecting device 9. The signal processor is electrically connected to the wafer stage.

The image processing method includes a halogen lamp used as a light source for emitting a coherent beam, a CCD camera 6 for converting a light signal into an electrical signal after detecting an incident diffraction light and outputting the electrical signal to a digital image processing system 8. The digital image processing system 8 is electrically connected to the wafer stage.

After the wafer alignment is performed as described above, a predetermined amount of light (for example, Ultra Violet:UV) is projected to a light exposure region 12 on the wafer 3 through a reduction projection lens 1 disposed on an upper portion of the wafer 3 to form a desired layer (for example, a conductive layer or an oxide film).

The operation of the alignment system of a conventional lithography apparatus will now be described in detail.

In the method using a diffraction light, a laser beam is emitted from the helium-neon laser which serves as a light source 7. A predetermined portion of the emitted beam is reflected, and the other portion thereof is transmitted through a plurality of beam splitters 4. The beams reflected from the beam splitters 4 are incident on the alignment mark 10 on the wafer 3 through the objective lens 2 to be diffracted. Among the diffracted lights, a zeroth order diffraction light is cut off by the spacial filter 11 during its incidence to the light collecting device 9 through the beam splitter 4, and a first order diffraction light reaches the light collecting device 9 after passing through a slit of the spacial filter 11. Accordingly, a light signal incident on the light collecting device 9 is converted into an electrical signal, and a data based on the converted signal is processed in the signal processor (not illustrated), and fed back to the wafer stage to serve as a position information signal of the wafer 3. Then the alignment of the wafer 3 is carried out.

In the digital image processing method, a coherent beam is emitted by using a halogen lamp (not illustrated) which serves as a light source. Among the emitted beam, a portion thereof is reflected through the plurality of beam splitters 4 and the other portion thereof is transmitted. The reflected beampasses through the objective lens 2 to be reflected on the alignment mark 10 on the wafer 3, and the reflected beam is formed as an enlarged image on the CCD camera 6 after passing through the beam splitter 4 to be converted into the electrical signal and applied to the digital image processing system. The digital image processing system uses a pattern matching method to process an inputted signal, and the processed signal is fed back to the wafer stage (not illustrated) to be used as a position information signal of the wafer 3, which is the completion of the alignment of the wafer 3.

However, according to the conventional alignment system of a lithography apparatus and the conventional method, since the positions of the alignment mark 10 and the light exposed region 12 for the alignment of the wafer 3 are different from each other, a base-line error occurs due to a mechanical and thermal drift of the light exposing apparatus, resulting in the lowering of a precision of the wafer alignment.

SUMMARY OF THE INVENTION

Accordingly, it is an object of the present invention to provide an improved alignment system of a lithography apparatus which is capable of obtaining an accurate alignment signal without being influenced by a height of an alignment mark on a wafer and a thickness of a photoresist.

To achieve the above and other objects, there is provided an improved alignment system of a lithography apparatus which includes a plurality of light sources emitting a light having respectively different wavelengths, a plurality of beam splitters which reflect some portion of the light emitted from the light source and transmit other portions of the light, a spacial filter for transmitting a light incident from the beam splitters, a first lens for condensing the light transmitted through the spacial filter, a wafer stage on an upper surface of which the wafer having a plurality of alignment marks to diffract a beam incident from the first lens is mounted, a second lens for condensing the light diffracted from the alignment mark on the wafer, a diffraction grating for diffracting the direction of the beam condensed by the second lens, a light collecting device for collecting the light reflected by the diffraction grating and converting the light into an electrical signal, and a control unit for controlling the wafer stage in accordance with the signal applied from the light collecting device.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 5A and 5B are graphs showing an intensity of a diffraction light in accordance with a height of the alignment mark, wherein FIG. 5A is a case when a semiconductor laser beam having central wavelength of 633 nm is used and FIG. 5B is a case when two kinds of semiconductor laser beams having the central wavelengths of 670 nm and 780 nm are mixed;

FIGS. 7A and 7B are graphs showing the square of an amplitude ratio of a diffraction light/an intensity ratio with respect to an incident light in accordance with a thickness of the resist, wherein FIG. 7A is a case when a semiconductor laser beam having the central wavelength of 633 nm is used and FIG. 7B is a case when two kinds of semiconductor laser beams having the central wavelengths of 670 nm and 780 nm are mixed.

DETAILED DESCRIPTION OF THE PREFERRED EMBODIMENTS

An alignment system of a lithography apparatus according to the present invention will now be described in detail, with reference to the accompanying drawings.

Figure 1:
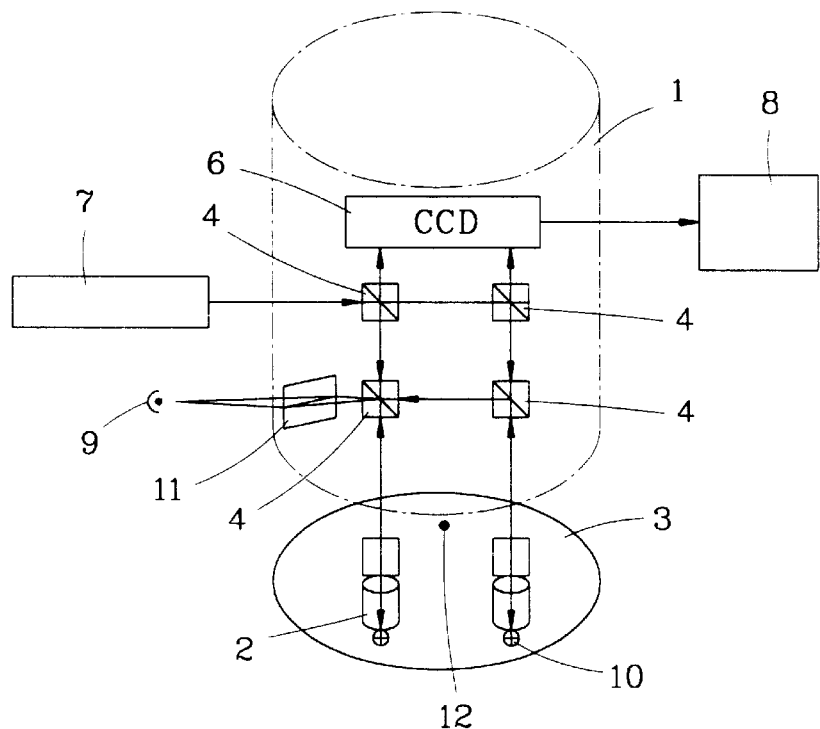
FIG. 1 is a view showing a construction of an alignment system of a lithography apparatus according to the conventional art.
Figure 2:
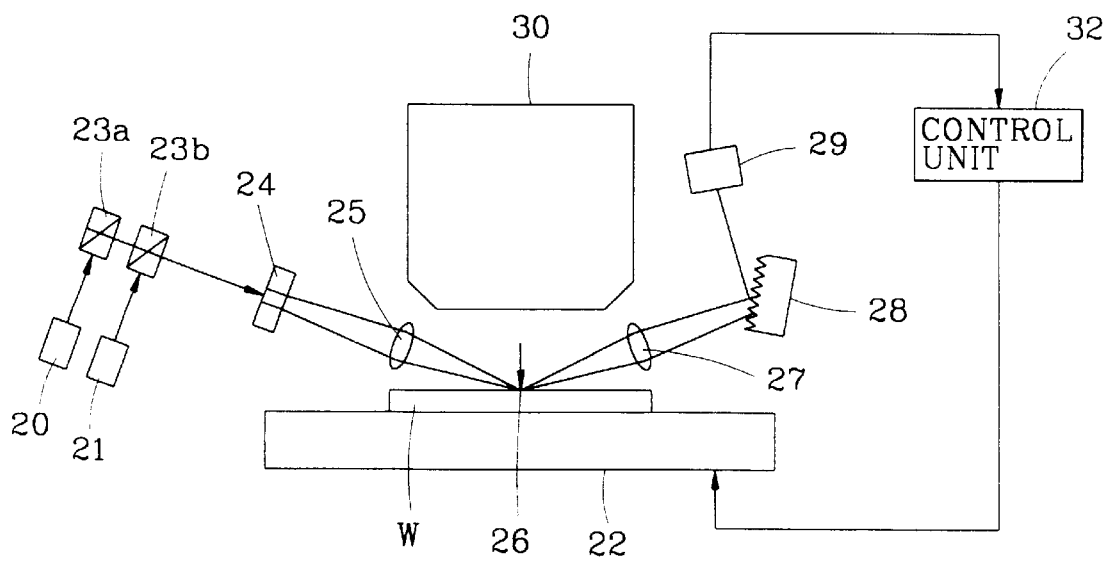
FIG. 2 is a view showing a construction of an alignment system of a lithography apparatus according to the present invention.

An alignment system of a lithography apparatus in FIG. 2 which operates on a single mode, includes two kinds of semiconductor laser 20, 21 for emitting semiconductor laser beams having the central wavelengths of 670 nm and 780 nm are used as a light source, beam splitters 23a, 23b for transmitting a portion of the laser beams emitted from the semiconductor lasers 20, 21 and reflecting the other portion thereof, a spacial filter 24 for transmitting a beam reflected by the beam splitters 23a, 23b, a first lens 25 for condensing the beam transmitted through the spacial filter 24, a wafer stage 22 on which a wafer (w) having an alignment mark 26 to diffract a beam condensed from the first lens 25 and incident at a constant angle is mounted, a second lens 27 for condensing the beam diffracted by the alignment mark 26 mounted on the wafer 22, a diffraction grating 28 for reflecting the condensed beam, and a light collecting device 29 for collecting a beam reflected by the diffraction grating 28. The light collecting device 29 is electrically connected to a control unit 32, which is electrically connected to the wafer stage 22.

It is desirable that a P polarized beam which is capable of transmitting through the photoresist 40 (FIG. 4) on the wafer (w) and reaching the alignment mark 26 thereon, is used as a laser beam incident on the wafer 22. Reference numeral 30 represents a reduction projection lens.

In the above embodiment, a reflective mirror may be used instead of the diffraction grating, which improves a precision of the apparatus since it can process a minuter signal in comparison with the reflective mirror.

An alignment system of a lithography apparatus having the above construction according to the present invention will now be described in detail.

A predetermined portion of the laser beam emitted from two semiconductor lasers 20, 21 having different central waveforms (in the above embodiment for example of, 670 nm, 780 nm) is reflected and the other portion thereof is transmitted by the beam splitters 23a, 23b. The reflected laser beam is mixed with each other, the mixed laser beam transmits through a slit of the spacial filter 24, and is then condensed by the first lens 25. The condensed beam is incident on an upper surface of the wafer (w) disposed on the wafer stage 22 at a predetermined angle. The incident beam is diffracted at an edge of the alignment mark 26 on the wafer (w) at a reflection angle identical to the incident angle. Here, among the different orders of the diffracted beam, only a first order diffracted beam is condensed by the second lens 27. This condensed beam is reflected by the diffraction grating 28 to reach the light collecting device 29. The light collecting device 29 converts the collected laser beam into an electrical signal to apply to the control unit 32. The control unit 32 compares the electrical signal with a standard signal, and feeds back the compared signal to the wafer stage 22 to carry out an alignment of the wafers.

Figure 3:
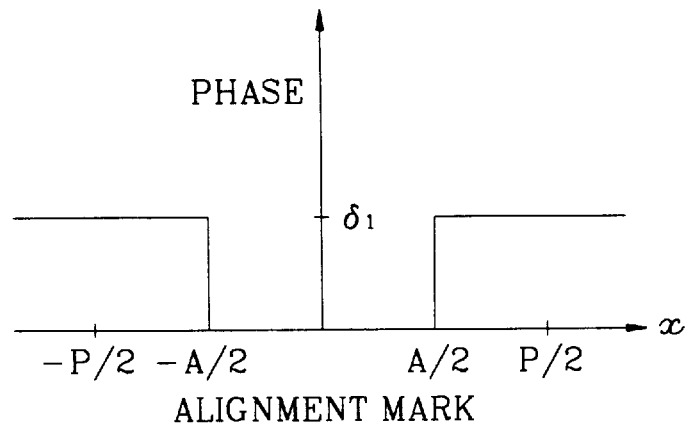
FIG. 3 is a graph showing a relation between a position of an alignment mark and a phase difference according to the present invention.

As shown in FIG. 3, the alignment mark 26 formed on the wafer includes a period (P) and a diffraction grating like the diffraction grating 28 having the size (A). When an alignment light is incident on the wafer having the above arrangement, in an area where the alignment light is smaller than the size A/2 of the diffraction grating 28, a phase difference($\delta_1$) does not occur, and in other portions of the wafer, the phase difference($\delta_1$) is produced.

Figure 4:
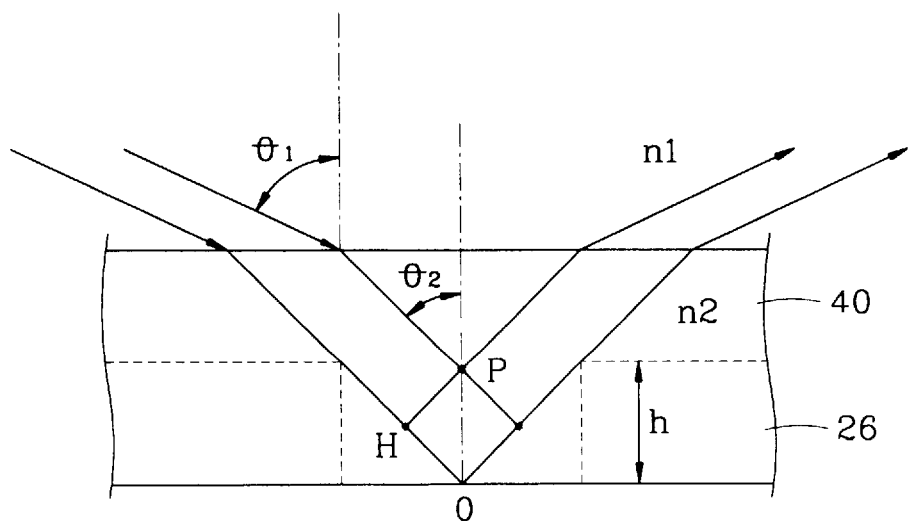
FIG. 4 is a lateral cross-sectional view of the wafer having a photoresist formed thereon according to the present invention.

As shown in FIG. 4, on the wafer (w) on which the alignment mark 26 is formed, the photoresist 40 is coated, and an alignment light gradiently illuminated at a predetermined angle($\theta_1$) on the wafer in an air having a refractive index of n 1, is refracted by a predetermined angle ($\theta_2$) by the photoresist 40 having the refractive index rate n 2.

As described above, the intensity of the first diffracted light used as an alignment signal for aligning the wafer (w) is represented as follows:

$$I_I = K(1 - \cos\delta_1) \quad (1)$$

$$K = \frac{2P^2}{\pi^2} \quad (2)$$

wherein P represents a period of an alignment mark, $\delta_1$ a phase difference($4\pi/\lambda)n_2 h\cos\theta_2$, $\lambda$ a wavelength, $n_2$ a refractive index of a photoresist, h a height of the alignment mark, and $\theta_2$ a refractive angle with respect to an incident angle $\theta_1$.

Figure 5A:
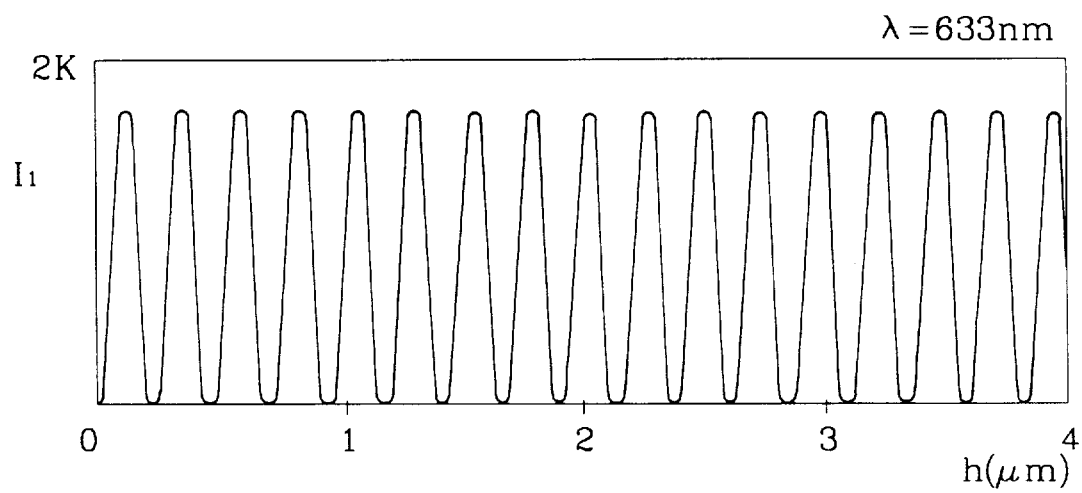

As shown in FIG. 5A, when the alignment light incident on the alignment mark 26 on the wafer (w) has a single wavelength, the height (h) of the alignment mark 26 is much influenced. That is, since the intensity of the first order diffraction beam is zero around where the heights of the alignment marks 26 are 0.25 μm, 0.5 μm and 0.75 μm, the position of the alignment mark cannot be found exactly, which makes it difficult to be adopted for the actual alignment of the wafer.

Figure 5B:
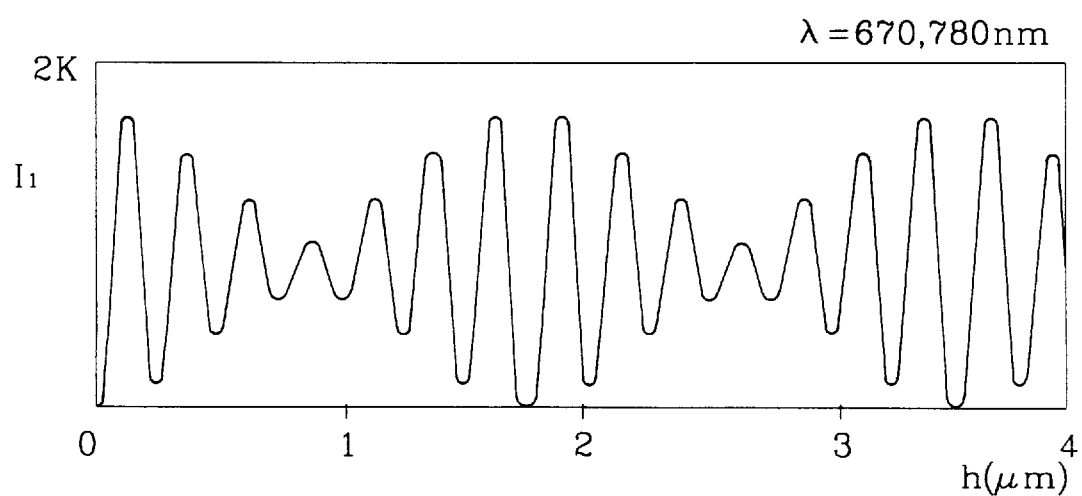

As shown in FIG. 5B, when the alignment light incident on the alignment mark 26 of the wafer (w) is composed of a light in which a laser beam having two different wavelengths is mixed, it can be seen that a signal of a first order diffraction beam which is sufficiently intense appears around a height of the alignment mark 26 0.5–1.4 µm. Therefore, since the position of the alignment mark can be found clearly, an actual application can be achieved.

Figure 6:
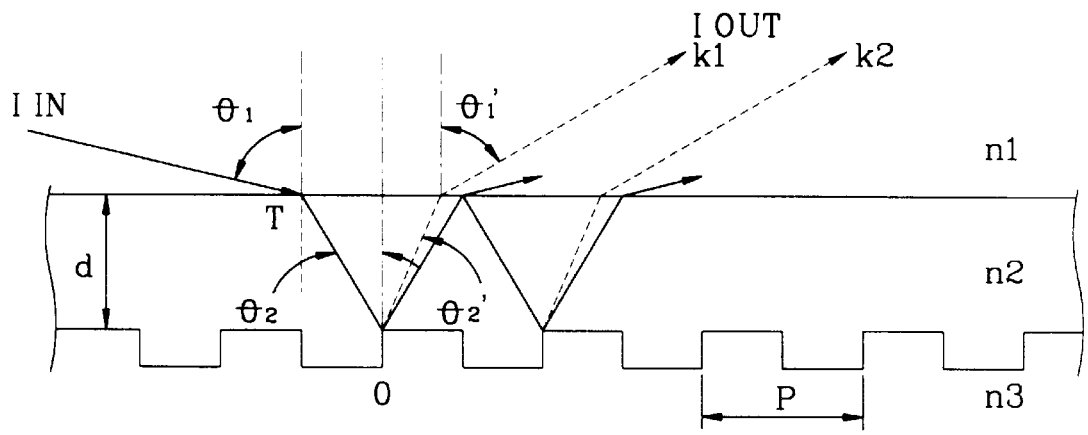
FIG. 6 is a lateral cross-sectional view showing a change of a laser beam in accordance with a thickness of a resist.

As shown in FIG. 6, among the alignment light incident on the wafer (w), a diffraction phenomenon occurs at the edge of the alignment mark 26 in the wafer (w). In the diffracted light, a full line represents a zeroth order diffraction light, and a dotted line first order diffraction lights(k1, k2). In the present invention, the first order diffraction light is collected to be used as an alignment signal. A photodiode is preferably used as a light collecting device, but a photomultiplier tube for multiplying a photocell may also be used. That is, any apparatus for converting a light signal into an electrical signal can be used as a light collecting device.

A general photoresist coated on the wafer has a thickness of less than 1 µm. In FIG. 6, "P" represents a period of an alignment mark 26 formed on the wafer, and "d" represents a thickness of the photoresist formed on the wafer. When the period of the alignment mark 26 is twice as large as the period of the diffraction grating 28, a signal to noise(S/N) ratio is enhanced.

The phase difference($\theta_2$) diffracted by the thickness of the photoresist can be obtained by the following equation:

$$\delta_2 = \frac{4\pi d n_2}{\cos\lambda_2} \cos\theta_2(1 - \sin\theta_2\sin\theta'_2) \quad (3)$$

wherein d represents a thickness of the resist, $\lambda$ a wavelength, $n_2$ a refractive index of the resist, $n_3$ a refractive index of the wafer, $\theta_1$ an incident angle at which the alignment light is incident on the resist on the wafer, $\theta_2$ an incident angle at which the alignment light is incident on the alignment from the resist to the alignment mark, and $\theta_2'$ a diffractive angle of the light first order diffracted by the reflection by the alignment mark.

Figure 7A:
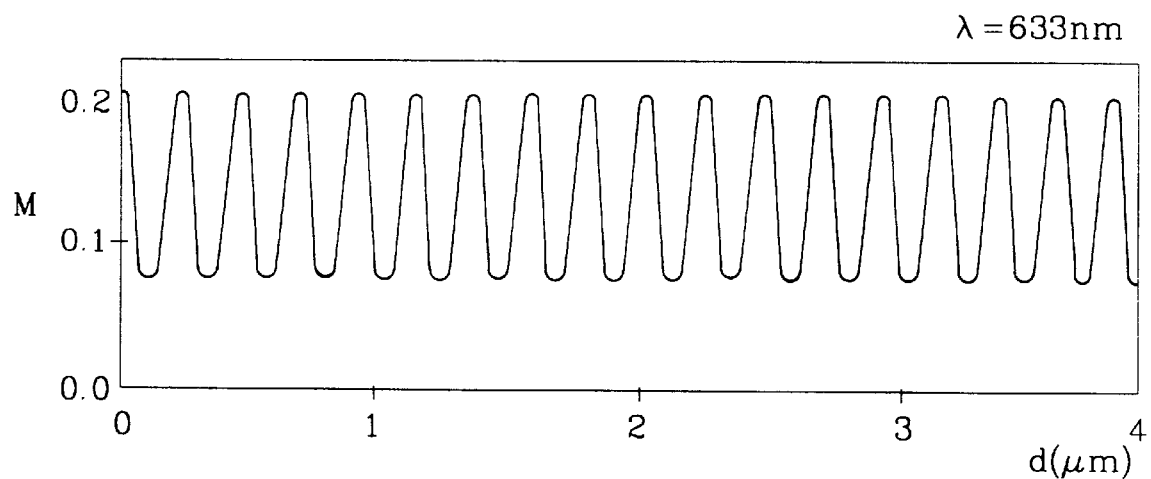
Figure 7B:
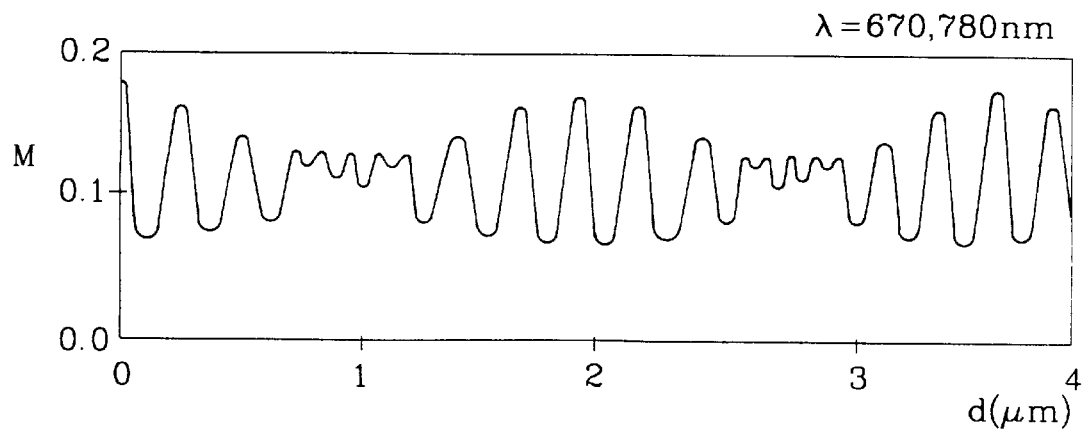

Moreover, FIGS. 7A and 7B show the square of an amplitude ratio of a diffraction light/an intensity ratio(M) with respect to an incident light. As shown in FIG. 7A, when a single laser beam is used, although a ratio of an intensity of the first order diffraction light is periodical with respect to the thickness of the resist, since the position of the alignment mark 26 cannot be exactly found, an actual application is impossible to achieve. However, as shown in FIG. 7B, when two kinds of laser beams is mixingly used, since the waveform representing a large intensity ratio around 1 µm appears periodically, the position of the alignment mark can be found exactly, so that alignment of the wafer can be effectively achieved.

A square intensity ratio of an amplitude of the diffracted light with respect to an incident light can be obtained in the following equation:

$$M = \left| \frac{A_0}{A_i} \right| = \frac{(t\mu_1 r'_2 t')^2}{1 + (\mu_0 r_1 r_2)^2 + 2\mu_0 r_2 r_1 \cos\delta_2} \quad (4)$$

wherein $A_0$ represents an amplitude of a first order diffraction light, $A_i$ an amplitude of an incident light, t a transparent coefficient of a light when the light is transmitted from the air (n1) to the resist (n2), t' the transparent coefficient of a first order diffracted light when the light is transmitted from the resist (n2) to the air (n1), $\mu_0$ a refractive index of the zeroth diffracted (that is, reflected) light, $\mu_1$ a refractive rate of the first order diffracted light, $r_1$ a reflective coefficient when the light is proceeded from the air (n1) to the resist (n2), $r_2$ a reflective coefficient of the zeroth order diffracted light when the light is proceeded from the resist (n2) to the alignment mark (Al or Si (n3)), $r_2'$ a reflective coefficient of the first order diffracted light when the light is proceeded from the resist (n2) to the alignment mark (Al or Si(n3)), and $\delta_2$ a phase difference of the light diffracted by the thickness of the resist.

As described above, since the light exposing position is identical to an alignment position, an alignment system of a lithography apparatus according to the present invention has the effect of minimizing an error of a base line generated when the two positions are different.

Further, since the present invention adopts a non-TTL (through the lens) method, it can be adopted into an alignment system of an x-ray lithography apparatus as well as into a light lithography apparatus, irrespective of the characteristic of a projection lens. Furthermore, since a semiconductor laser is used as a light source, the size of the system is effectively minimized.

Moreover, by using a mixed laser beam, an alignment signal can be obtained without being influenced by the thickness of the photoresist formed on the wafer, and by controlling a polarization of a light, a signal to noise (S/N) ratio of an alignment signal can be advantageously enhanced.

In the above embodiment, two kinds of laser beams are used as a light source, but by mixing more than four kinds of light sources and by appropriately combining an alignment light, the system can be optimized.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An alignment system of a lithography apparatus, comprising:
   a plurality of light sources for emitting light beams having different wavelengths;
   a plurality of beam splitters for transmitting a mixed light from the light beams from the light sources;
   a spatial filter for transmitting the mixed light from the beam splitters;
   first lens means for condensing the mixed light transmitted through the spatial filter;
   a wafer stage having a wafer mounted thereon, the wafer having a plurality of alignment marks for diffracting the mixed light from the first lens means;
   second lens means for condensing the mixed light diffracted by the alignment marks of the wafer;
   a diffraction grating for further diffracting the mixed light from the second lens means;
   a light collecting device for collecting the light from the diffraction grating and converting the light into an electrical signal; and
   a control unit from controlling the wafer stage in accordance with the electrical signal received from the light collecting device.

2. The system of claim 1, wherein each of the light sources is a semiconductor laser.

3. The system of claim 1, wherein each of the beam splitters transmits an S-wave and reflects a P-wave.

4. The system of claim 1, wherein the position of an alignment light incident on the wafer is identical to that of an exposure light for patterning the wafer.

5. The system of claim 1, wherein the light collecting device includes a photodiode.

6. The system of claim 1, wherein a period of the alignment marks on the wafer is twice as large as a period of the diffraction grating.

7. The system of claim 1, wherein the plurality of light sources includes two light source which generate light beams having wavelengths of approximately 670 nm and 780 nm, respectively.

8. The system of claim 1, wherein the first lens means includes a first lens and the second lens means includes a second lens.

9. The system of claim 1, where in the mixed light from the first lens means impinges on the alignment marks of the wafer at an incident angle of less than 90° with respect to a surface of the wafer.

10. The system of claim 1, wherein the beam splitters, the spatial filter and the first lens means are substantially aligned to each other to impinge the mixed light on the alignment marks at an incident angle of less than 90° with respect to a surface of the wafer.

11. The system of claim 1, wherein the control unit compares the electrical signal with a standard signal to control the wafer stage in accordance with the comparison result.

12. An alignment system for a semiconductor wafer, comprising:

a first light source for generating a first laser beam having a first wavelength;

a second light source for generating a second laser beam having a second wavelength;

a plurality of beam splitters for combining the first and second laser beams and transmitting the combined laser beam from the first and second light sources;

a spatial filter for transmitting the combined laser beam from the beam splitters therethrough;

first condensing means for condensing the combined laser beam from the spatial filter unto a wafer mounted on a wafer stage, the wafer having alignment marks thereon, the combined laser beam impinging on the alignment marks on the wafer at an incident angle of less than 90° and being diffracted by the alignment marks to generate a diffracted laser beam;

second condensing means for condensing the diffracted laser beam from the alignment marks;

diffraction means for changing the direction of the diffracted laser beam from the second condensing means;

a light collecting device for collecting the diffracted laser beam from the diffraction means and converting it into an electrical signal; and a control unit for controlling the wafer stage to control alignment of the wafer thereon in accordance with the electrical signal from the light collecting unit.

13. The alignment system of claim 12, wherein the first wavelength is approximately 670 nm and the second wavelength is approximately 780 nm.

14. The alignment system of claim 13, wherein the diffraction means includes a diffraction grating having a period which is approximately one half of a period of the alignment marks on the wafer.

15. The alignment system of claim 14, wherein the position of the combined laser beam incident on the wafer is identical to that of a light used to pattern the wafer.

16. The alignment system of claim 15, wherein the beam splitters, the spatial filter and the first condensing means are substantially aligned to each other to impinge the combined laser beam on the alignment marks on the wafer at the incident angle of less than 90° with respect to a surface of the wafer.

17. The alignment system of claim 12, wherein the first and second condensing means include first and second lenses, respectively.

18. The alignment system of claim 12, wherein a first order diffracted laser beam from the alignment marks on the wafer is received and condensed by the second condensing means.

19. The alignment system of claim 18, wherein the diffraction means further diffracts said first order diffracted laser beam from the second condensing means.

20. The system of claim 1, wherein a first order diffracted beam from the alignment marks on the wafer is received and condensed by the second lens means.

* * * * *